(12) United States Patent
Tews et al.

(10) Patent No.: US 7,157,329 B2
(45) Date of Patent: Jan. 2, 2007

(54) TRENCH CAPACITOR WITH BURIED STRAP

(75) Inventors: Helmut Tews, Munich (DE); Jochen Beintner, Wappingers Falls, NY (US); Stephan Kudelka, Ottendorf-Okrilla (DE)

(73) Assignee: Infineon Technologies Aktiengesellschaft, Munich (DE)

( * ) Notice: Subject to any disclaimer, the term of this patent is extended or adjusted under 35 U.S.C. 154(b) by 40 days.

(21) Appl. No.: 11/053,508

(22) Filed: Feb. 8, 2005

(65) Prior Publication Data

US 2005/0158961 A1 Jul. 21, 2005

Related U.S. Application Data

(62) Division of application No. 10/248,801, filed on Feb. 20, 2003, now Pat. No. 6,853,025.

(51) Int. Cl.
*H01L 21/8234* (2006.01)
(52) U.S. Cl. ............... 438/243; 438/244; 438/245; 438/246; 438/241; 257/E21.651
(58) Field of Classification Search ............... 438/244, 438/248, 249, 270, 243, 245, 246, 241
See application file for complete search history.

(56) References Cited

U.S. PATENT DOCUMENTS

| | | | |
|---|---|---|---|
| 5,895,255 A * | 4/1999 | Tsuchiaki | .............. 438/427 |
| 6,200,851 B1 | 3/2001 | Arnold | |
| 6,326,275 B1 | 12/2001 | Harrington et al. | |
| 6,333,531 B1 | 12/2001 | Wang et al. | |
| 6,368,912 B1 | 4/2002 | Chang et al. | |
| 6,391,705 B1 | 5/2002 | Hsiao et al. | |
| 6,579,759 B1 | 6/2003 | Chudzik et al. | |
| 6,638,815 B1 * | 10/2003 | Bronner et al. | .............. 438/246 |
| 6,693,041 B1 * | 2/2004 | Divakaruni et al. | ......... 438/702 |
| 6,727,141 B1 | 4/2004 | Bronner et al. | |
| 6,740,920 B1 | 5/2004 | Chidambarrao et al. | |
| 2003/0082875 A1 * | 5/2003 | Lee | ........................... 438/243 |
| 2004/0113230 A1 * | 6/2004 | Divakaruni et al. | ......... 257/510 |

OTHER PUBLICATIONS

Muller, K.P., et al., "Trench Storage Node Technology for Gigabit DRAM Generations," IEDM 1996, pp. 507-510.
Radens, C.J., et al., "A 0.135 µm$^2$ 6F$^2$ Trench-Sidewall Vertical Device Cell for 4Gb/16Gb DRAM," 2000 Symposium on VLSI Technology Digest of Technical Papers, pp. 80-81.
Saida, S., et al., "Single Layer Nitrdie Capacitor Dielectric Film and High Concentration Doping Technology for 1Gb/4Gb Trench-type DRAMs," IEDM 1997, pp. 265-268.
Weis, R., et al., "A Highly Cost Efficient 8Ff$^2$ DRAM Cell with a Double Gate Vertical Transistor Device for 100nm and Beyond," IEDM 2001, pp. 415-418.

* cited by examiner

*Primary Examiner*—Asok K. Sarkar
*Assistant Examiner*—Victor V. Yevsikov
(74) *Attorney, Agent, or Firm*—Slater & Matsil, L.L.P.

(57) ABSTRACT

A trench capacitor with improved strap is disclosed. The strap is located above the top surface of the capacitor. The top surface of the trench capacitor, which is formed by the top surfaces of the collar and storage plate, is planar. By locating the strap on a planar surface, the divot present in conventional strap processes is avoided. This results in improved strap reliability and device performance.

14 Claims, 8 Drawing Sheets

TRENCH CAPACITOR WITH BURIED STRAP

This application is a divisional of patent application Ser. No. 10/248,801, entitled "Trench Capacitor With Buried Strap," filed on Feb. 20, 2003, now U.S. Pat. No. 6,853,025, which application is incorporated herein by reference.

FIELD OF THE INVENTION

The present invention relates to integrated circuits (ICs). More particularly, the invention relates to integrated circuits with trench capacitors.

BACKGROUND OF THE INVENTION

A dynamic random access memory (DRAM) cell includes a transistor coupled to a capacitor. One type of DRAM cell employs the use of a trench capacitor coupled to a vertical transistor. FIG. 1 shows a cross-sectional view of a conventional trench capacitor 140. As shown, the trench capacitor is disposed in a lower portion 111a of a trench 110 formed in a substrate 105. A pad layer 190 is provided on the surface of the substrate. The pad layer comprises silicon nitride layer 192 over a silicon oxide layer 191. The pad layer facilitates processing of the trench capacitor.

The trench capacitor includes bottom and top sections 141a–b. A buried plate 144 surrounds the trench in the bottom section of the capacitor. A highly conducting semiconductor material or metal 142 (fill material) fills the trench, separated from the buried plate by a node dielectric layer 146. The buried plate, for example, is commonly coupled to other capacitors of the array and to a reference voltage, such as $V_{DD}/2$. A thick dielectric collar 165 lines the trench sidewalls in the top section of the capacitor.

A vertical transistor (not shown) is provided in the upper portion 111b of the trench. To isolate the capacitor from the transistor, an isolating dielectric layer 148 is provided on top of the capacitor. To couple the trench capacitor to the transistor, a buried diffusion region 132 is provided. The diffusion region is created by outdiffusing dopants from the fill material through a buried strap 174 located between the collar and isolation dielectric layer.

FIG. 2 shows a conventional process for forming a buried strap. After the capacitor is formed, the trench fill material is recessed below the surface of the substrate, exposing the collar in the upper portion 111b of the trench. The exposed portion of the collar is then removed by, for example, a wet etch. The etch overetches the collar, recessing it below the surface of the trench fill material 142. The over etch creates a divot 271. An amorphous silicon layer 273 is then deposited to line the trench and fill the divot. The amorphous silicon layer is etched by, for example, an isotropic reactive ion etch (RIE) or wet etch to remove the amorphous silicon layer 273 from the pad layer and storage node material, thus leaving the amorphous silicon layer in the divot to form the buried strap.

However, due to the small dimensions of the divot and to the non-ideal conformal deposition of the amorphous silicon layer, a void 277 may be created during the divot fill process. The void results in incomplete filling of the divots, which can degrade the coupling between the transistor and capacitor. This can adversely affect the performance and/or reliability of the memory cell.

From the foregoing discussion, it is desirable to provide a trench capacitor, which avoids the problems associated conventional buried straps.

SUMMARY OF THE INVENTION

The invention relates to integrated circuits and fabrication of integrated circuits in general. More particularly, the invention relates to straps used in for example, trench capacitors. In one embodiment, the IC includes a trench formed in a substrate. The trench comprises includes upper and lower portions, wherein the lower portion includes top and bottom sections. A trench capacitor is disposed in the lower portion of the trench. The trench capacitor includes a storage plate in the lower portion of the trench and a node dielectric layer lining the trench sidewalls in the bottom section. A dielectric collar lines the trench sidewalls in the top section of the lower portion of the trench. The top surface of the trench capacitor, which is formed by the top surfaces of the collar and storage plate is planar. A strap is located on at least a portion of the top surface of the capacitor.

By forming the strap on a planar surface, the divot present in conventional strap processes is avoided. This results in improved strap reliability and device performance.

DETAILED DESCRIPTION OF THE INVENTION

Figure 1:
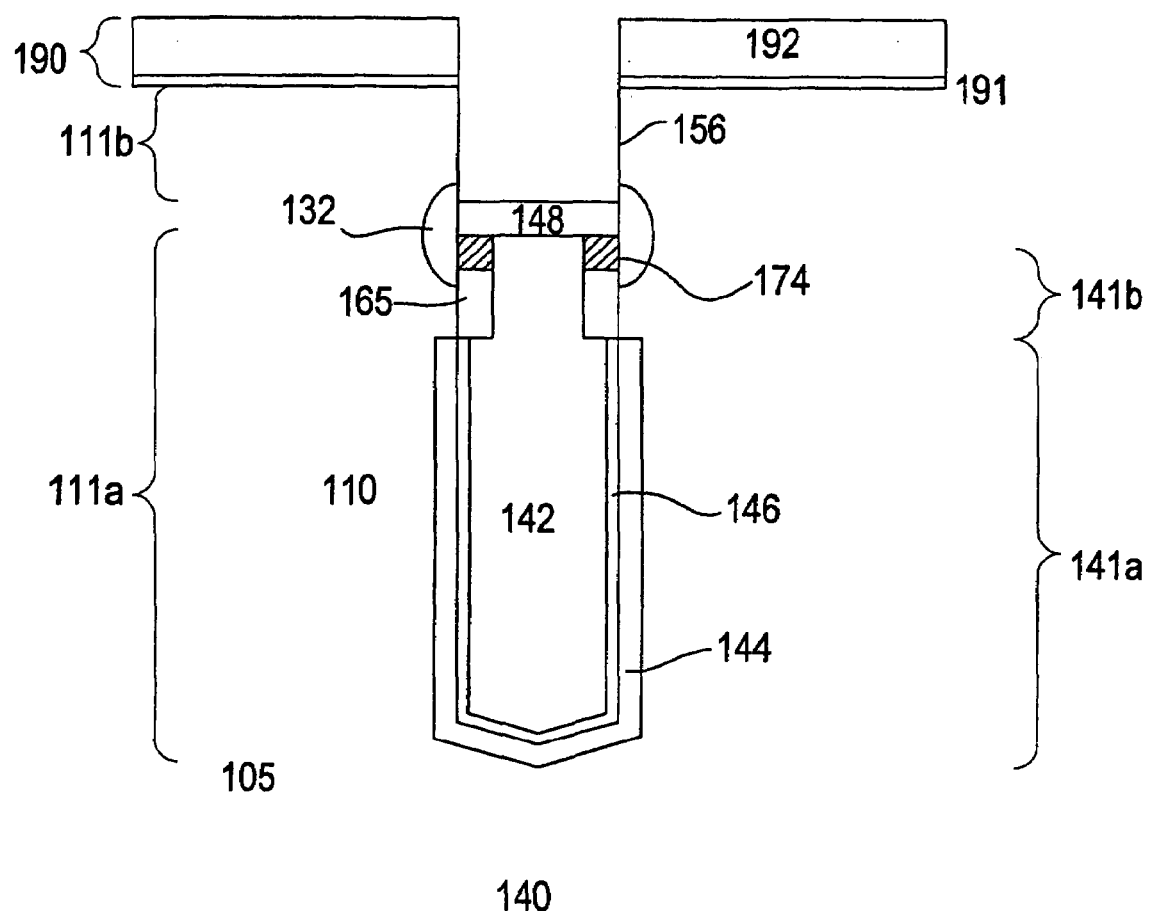
FIG. 1 shows conventional trench capacitor.
Figure 2:
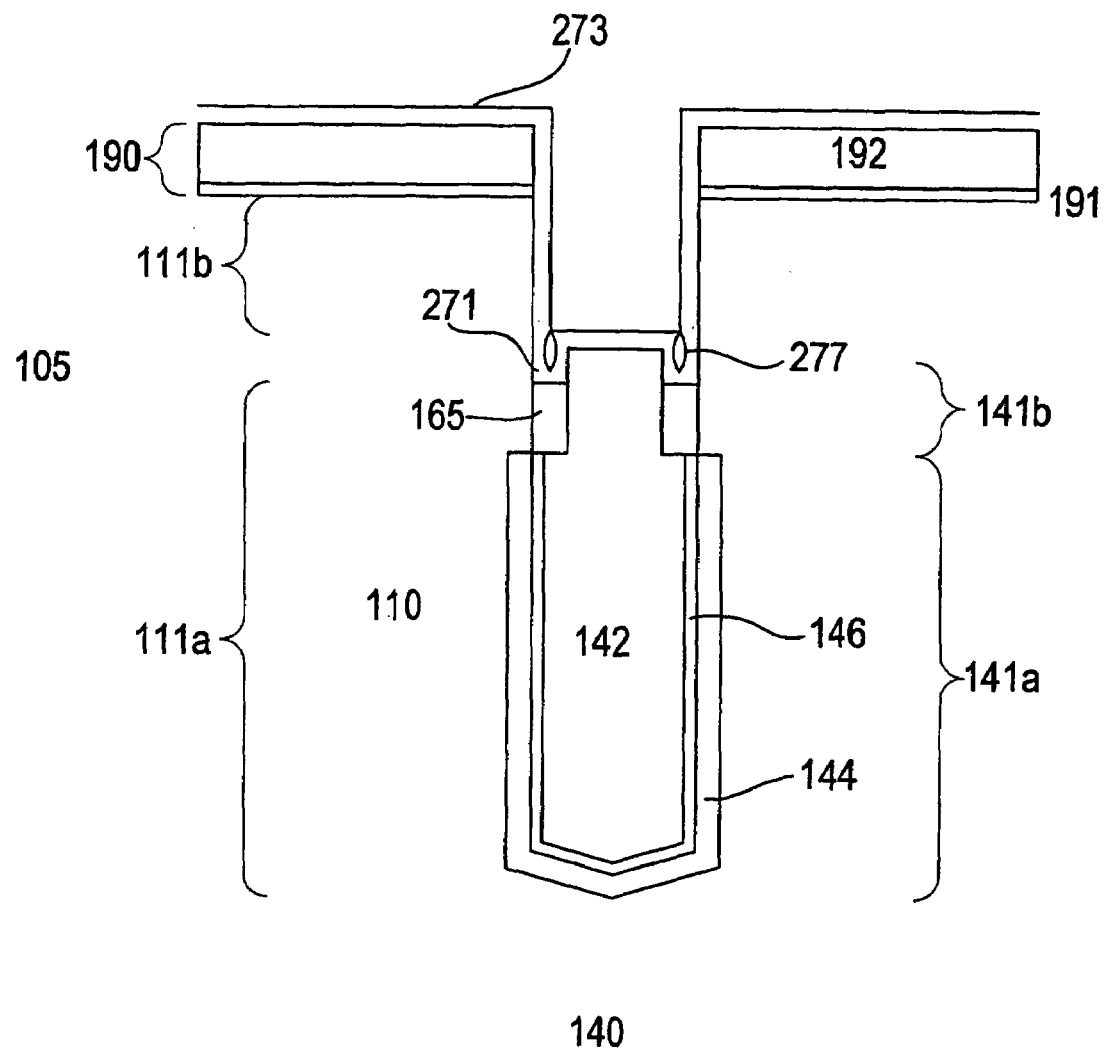
FIG. 2 shows a process for forming a buried strap in conventional trench capacitors.
Figure 3A:
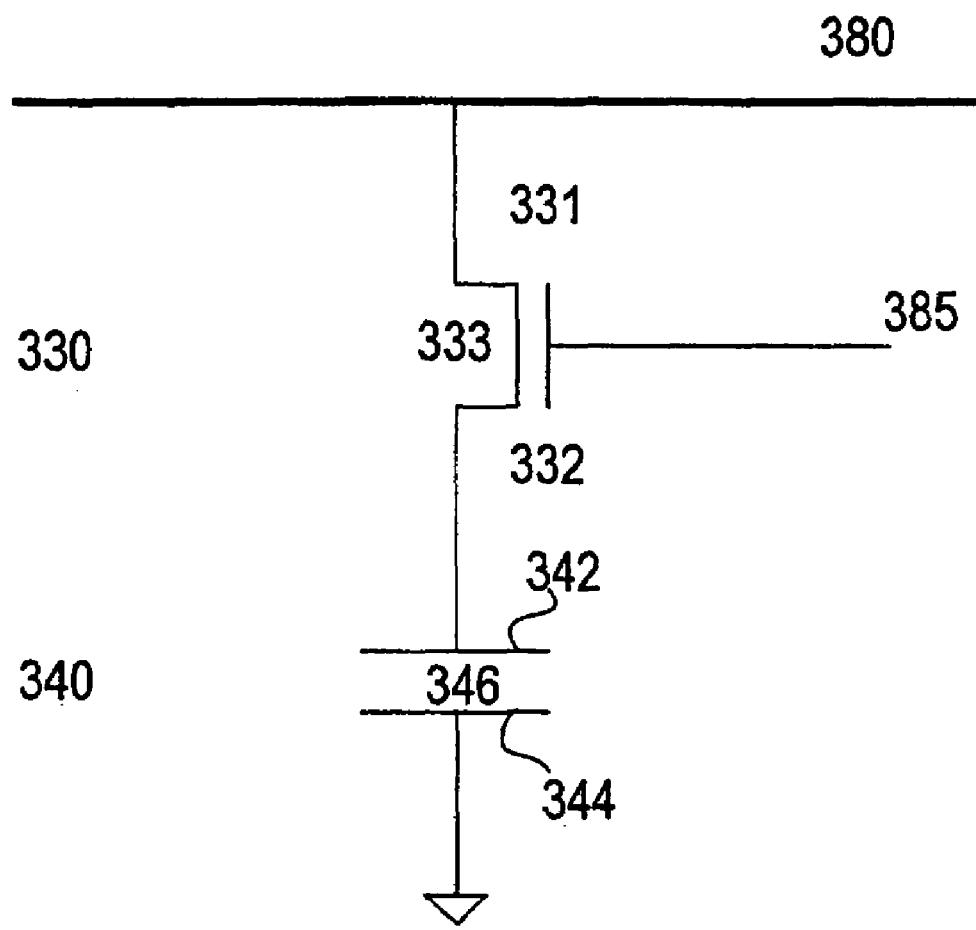
FIGS. 3a–b show a schematic diagram and cross-section view of a memory cell in accordance with one embodiment of the invention.
Figure 3B:
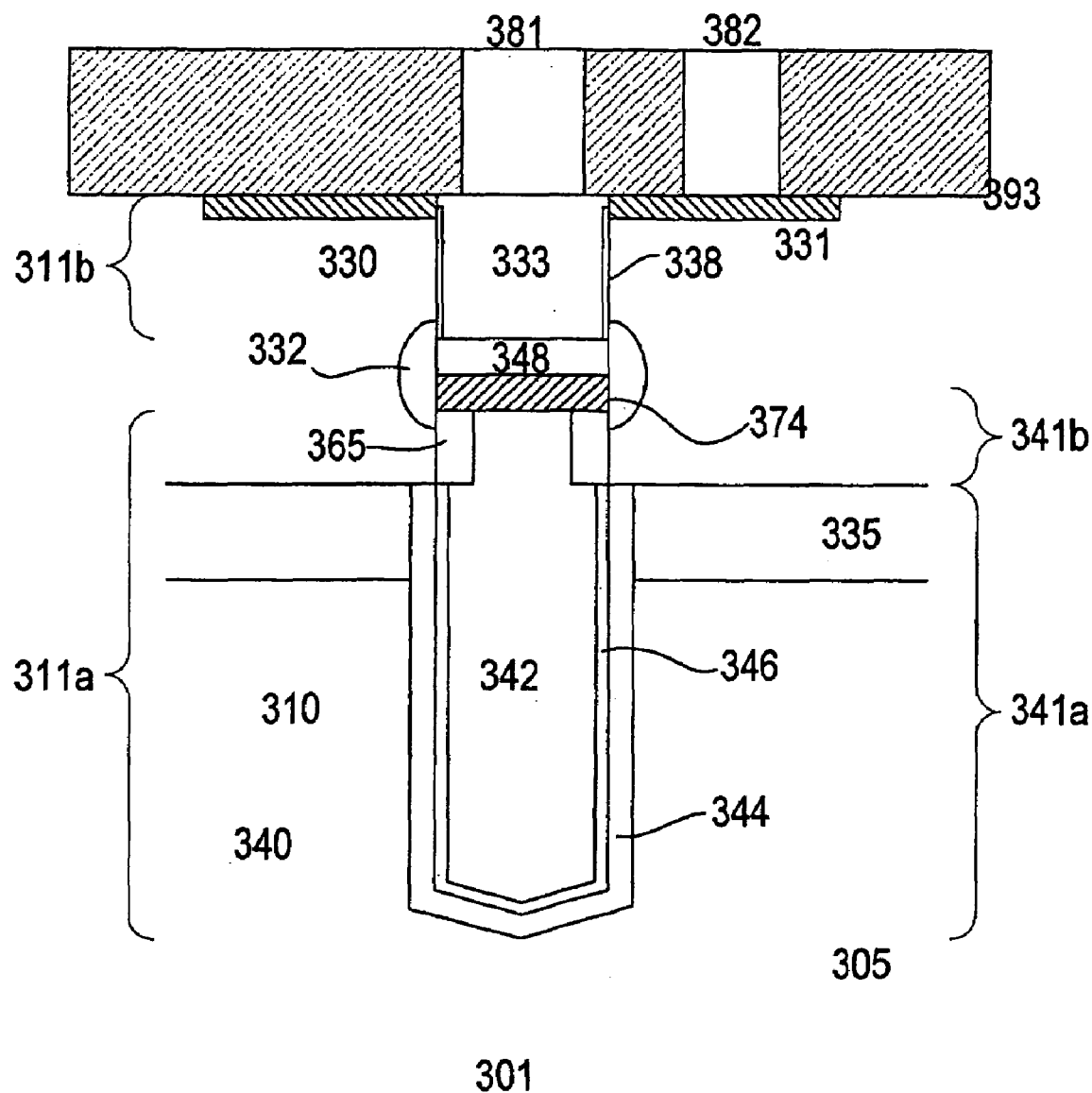

FIGS. 3a–b show a schematic diagram and a cross-sectional view of a memory cell 301 in accordance with one embodiment of the invention. The memory cell includes a trench capacitor 340 coupled to a transistor 330. A first diffusion region of the transistor is coupled to a bitline 380 and a gate 333 of the transistor is coupled to a wordline 385. A plurality of memory cells are interconnected by wordlines and bitlines to form a memory array. The array and support circuitry for accessing the memory cells form, for example, a memory IC. Other types of ICs can also be formed, such as systems on chip embedded with memory.

The trench capacitor is located in a lower portion 311a of a trench 310 formed in a substrate 305. The trench capacitor comprises bottom and top sections 341a–b. A first capacitor plate 342 is located in the trench. In one embodiment, a second plate 344 is also provided. The second plate surrounds the trench in the lower section of the capacitor. The plates are separated by a node dielectric layer 346. Various dielectric materials, such as silicon oxide, silicon nitride or dielectric material with a high dielectric constant can be used to form the node dielectric layer. Providing a node dielectric layer comprising a plurality of different dielectric layers (e.g., dielectric sandwich) can also be useful.

A buried layer 338 can be provided in the substrate. The buried layer, in one embodiment, commonly couples the second plates of the array to, for example, a reference voltage such as $V_{DD}/2$. Other reference voltage levels such as ground are also useful. In the top section of the capacitor, a dielectric collar 365 is provided to line the trench sidewalls. The dielectric collar comprises silicon oxide or other highly isolating material.

As shown, the top and bottom sections of the trench capacitor have about the same dimensions. Providing a trench capacitor having top and bottom sections with different dimensions is also useful. For example, the bottom section can be larger than the top section to form a bottle shaped trench capacitor. The trench capacitor can also have a top section, which is larger than the bottom section.

In accordance with one embodiment of the invention, a buried strap 374 is provided over a top surface of the trench capacitor. The top surface of the capacitor includes the top surfaces of the dielectric collar and first plate. In one embodiment, the top surface of the capacitor comprises a substantially planar surface (e.g., top surfaces of the collar and first plate are substantially co-planar). As such, the divot present in conventional strap processes is avoided. The divot fill process, as previously described, can affect the reliability and resistance of the strap. Thus, by eliminating the divot in strap processes, improved reliability and performance can be achieved.

In one embodiment, the buried strap comprises silicon. Preferably, the buried strap comprises amorphously deposited silicon. Polysilicon is also useful to serve as the buried strap. Other types of material, such as SiGe or Ge can also be useful. The buried strap can be doped or undoped. For a doped buried strap, it is preferably doped with the same type of dopant as the transistor type. For example, n-type dopants such as phosphorous (P) and/or arsenic (As) can be for n-type transistors. The use of p-type dopants such as boron (B) is used for p-type transistors.

For a given material, the thickness of the strap is directly related to its electrical resistance (e.g., the thicker the strap is, the higher the electrical resistance). The electrical resistance of the strap can affect the performance, such as access time, of the memory cell. The strap thickness is preferably selected to optimize performance of the memory cell. In one embodiment, the thickness is about 50 nm and 300 nm. Other thicknesses are also useful, and may vary depending on material and/or performance requirements.

The transistor comprises a gate 333 and first and second diffusion regions 331 and 332. In one embodiment, the transistor comprises a vertical transistor having its gate or at least a portion of its gate located in the upper portion of the trench. In one embodiment, the transistor surrounds the trench. Such vertical transistors are described in, for example, Weis et. al., "A Highly Cost Efficient 8F² DRAM Cell with a Double Gate Vertical Transistor Device for 100 nm and Beyond", International Electron Device Meeting IEDM, Washington (2001), which is herein incorporated by reference for all purposes. Alternatively, the transistor is situated on one side of the trench (e.g., gate occupies one side of the upper portion of the trench). Such types of vertical transistors are described in, for example, Radens et al., "A 0.135 mm² 6F² Trench-Sidewall Vertical Device Cell for 4 Gb/16 Gb DRAM", Symposium on VLSI Technology, Hawaii (2000), which is herein incorporated by reference for all purposes. Other types of vertical transistors are also useful.

The gate of the transistor is disposed in the upper portion of the trench, with a first end toward the surface of the substrate and a second end adjacent to the bottom of the upper portion of the trench. In one embodiment, the gate is disposed in at least a portion of the upper portion of the trench. For example, the gate occupies one side of the trench. Providing a gate disposed in the upper portion of the trench is also useful.

The first diffusion region is located on the substrate surface. In one embodiment, the diffusion is adjacent to the first end of the gate. Preferably, the diffusion region surrounds at least the portion of the trench adjacent to the gate. Providing the diffusion region on the substrate surface, which surrounds the trench is also useful. In one embodiment, dopants from the first plate are diffused out through the buried strap to form the second diffusion region of the transistor. The second diffusion region couples the transistor to the capacitor.

In one embodiment, the second diffusion region is located in the substrate surrounding the trench adjacent to the second end of the gate. Providing a second diffusion region, which surrounds the trench adjacent to the interface between the upper and lower portion of the trench is also useful. For applications in which the gate occupies a portion of the trench, the buried strap is preferably located on a portion of the surface of the upper trench adjacent to the gate. This can be achieved, for example, by patterning the gate and buried strap together.

A dielectric layer 335 lines the trench sidewall. Lining a portion of the trench sidewall with the dielectric layer is also useful. In one embodiment, the dielectric layer lines at least the portion of the trench sidewall adjacent to the gate. The dielectric layer serves as the gate oxide of the transistor. To isolate the gate from the capacitor, an isolation dielectric layer 348 is provided above the buried strap.

In one embodiment, contacts 381 and 382 are provided to couple the gate and first diffusion region to a wordline and a bitline, respectively. The contacts are isolated by a dielectric layer 393, such as silicon oxide. Other dielectric materials are also useful to isolate the contacts.

Figure 4:
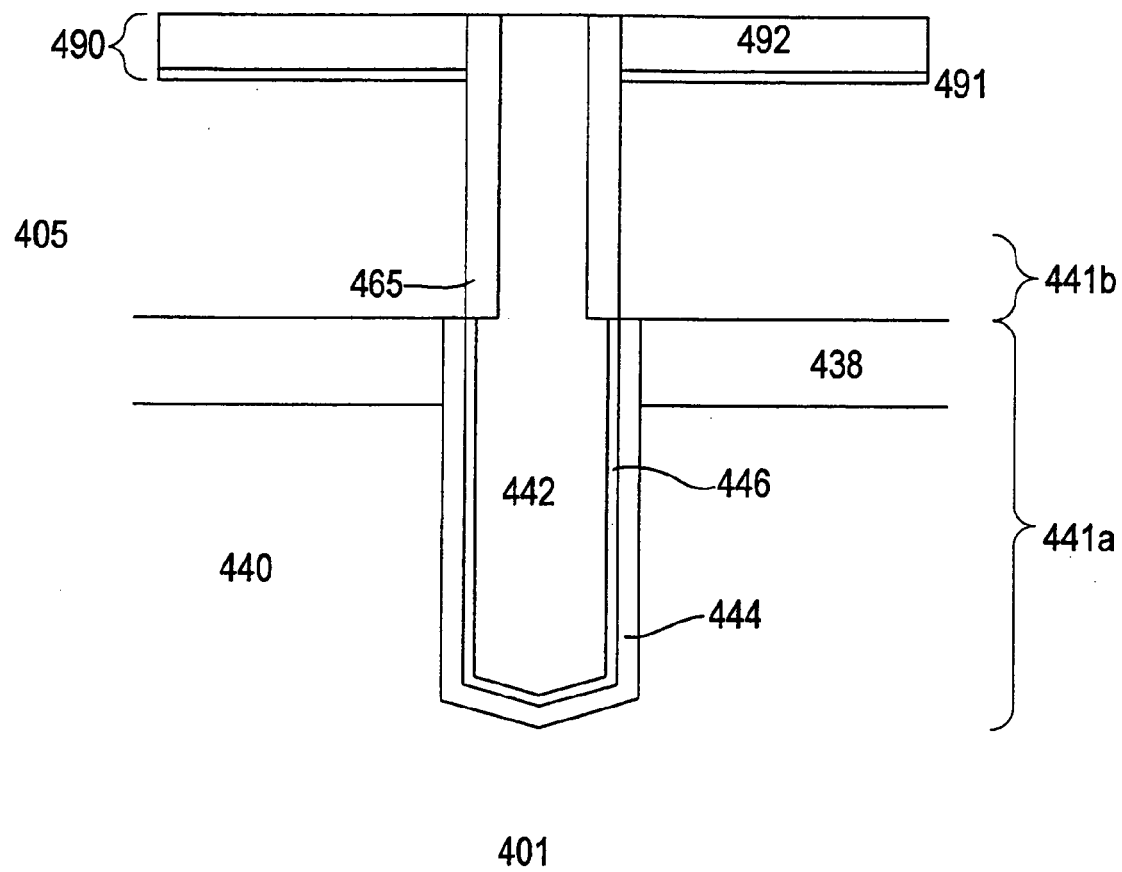
FIGS. 4–7 show a process for forming a buried strap of a trench capacitor in accordance with one embodiment of the invention.

FIGS. 4–7 show a process for forming a memory cell in accordance with one embodiment of the invention. Referring to FIG. 4, a semiconductor substrate 405 is provided. The substrate, for example, comprises silicon. Other types of substrates are also useful. Preferably, the substrate is lightly doped with p-type dopants, such as boron. Doping the substrate with other types of dopants is also useful.

The substrate is prepared with a trench capacitor 440. To facilitate processing, a pad layer 490 is provided on the substrate surface. The pad layer includes, for example, a pad oxide 491 under a pad nitride 492. In one embodiment, the trench capacitor is formed in a trench 410 etched in the substrate. The trench is, for example, about 8–10 um deep. Typically, the width of the trench is equal to about the minimum lithographic feature size. Other trench dimensions are also useful.

The trench capacitor can be formed by various known techniques. Such techniques, for example, are described in, for example, Muller et al., "Trench Storage Node Technology for Gigabit DRAM Generations" International Electron Device Meeting IEDM Technical Digest (1996), which is herein incorporated by reference for all purposes. In one embodiment, the trench capacitor is formed by etching a trench in a substrate. The substrate can be prepared with doped wells and doped buried layers as needed. To etch the trench, a hard mask layer is used. The hard mask layer, for example, comprises silicon oxide. Other hard mask materials are also useful. The hard mask, for example, is located above the pad layer. It is removed after the trench etch by wet chemical etching.

The trench comprises top and bottom sections. The top part of the trench houses the vertical array transistor 111*b* and the trench collar 141b. Typically, the bottom section begins at about 1 um from the surface of the substrate. Providing a trench having bottom section beginning at other depths are also useful, depending or process and performance requirements.

A first plate 442 of the capacitor is located in the trench. A dielectric collar 465 lines the top section of the trench. In one embodiment, a second plate 444 surrounds the first plate in the bottom section of the trench, separated by a node dielectric layer 446. A buried layer 438 is provided in the substrate. The buried layer, for example, commonly couples the second plates of the capacitors of the array to a reference voltage. The first plate, second plate, and buried layer comprise dopants of a first type. In one embodiment, the first dopant type is n-type, such as arsenic or phosphorous. Alternatively, the dopants are p-type dopants, such as boron.

After the trench is etched, the buried plate is formed. In one embodiment, the trench sidewalls are lined with a layer doped with dopants of the first type. The doped layer serves as a dopant source. The layer, for example, comprises polysilicon or silicate glass doped with arsenic. Other types of dopants or materials are also useful. The doped layer is then removed from the sidewalls in the upper portion of the trench. To remove the doped layer from the upper portion of the trench, a sacrificial material can be deposited to fill the trench portion and recessed to expose the upper portion.

A dielectric layer is then deposited to cover the doped layer and to protect the exposed upper portion of the trench. In one embodiment, the dielectric layer comprises silicon oxide. Other types of dielectric materials, such as silicon nitride, are also useful. A thermal cycle is performed to outdiffuse the dopants from the doped layer into the substrate surrounding the bottom section of the trench to create the buried plate. Following the diffusion step, the dielectric layer and the doped layer are removed.

Alternatively, the buried plate can be formed using gas phase doping. In this case, the collar 465 or a sacrificial dielectric collar (not shown) is formed prior to the outdiffusion step and serve as a mask for the buried plate formation. Forming the buried plate by gas phase doping is described in, for example, Saida et al., "Single Layer Nitride Capacitor Dielectric Film and High Concentration Doping Technology for 1 Gb/4 Gb Trench-type DRAMs", IEDM Technical Digest (1997), which is herein incorporated by reference for all purposes. In another embodiment, the buried plate can be formed by creating a doped layer which lines the bottom section of the trench. The doped layer, for example, comprises polysilcon or epi. Other types of doped layer or metal layers can also be used to serve as the buried plate.

After the buried plate is formed, a node dielectric layer is formed to line the bottom section of the trench. The node dielectric layer comprises, for example, silicon oxide, silicon nitride, or composite of both. Other types of dielectric materials, especially dielectric layers with high dielectric constant (high-k materials) or dielectric sandwich, can also be used. The node dielectric layer can be formed using various conventional techniques, such as thermal oxidation and/or nitridation. For high-k dielectrics, chemical vapor deposition (CVD) or atomic layer deposition techniques can be used. The trench is then filled with a highly conductive trench fill material (e.g., doped polysilicon). Excess fill material is removed by, for example, CMP or etch back process. Other techniques for forming the trench capacitor are also useful The collar layer 465 in FIGS. 4–7 can be manufactured in several different ways depending on the trench technology process. The collar can be formed after trench etch. In this case it serves as a mask for buried plate formation. In addition, it allows for trench surface enhancement by chemical wet or dry etching to create a bottle shape trench. In an alternate scheme, the collar is formed after buried plate formation 444, node dielectric 446 and trench fill 442. In this case, the trench fill material 442 is recessed to the depth of the collar by wet or dry chemical etching. In a following step, the collar is formed either by thermal oxidation or by oxide deposition. After a unisotropic reactive ion etch step (RIE) to open the bottom of the deposited collar, the trench is filled again with the trench fill material 442 and planarized using CMP. Other alternative schemes for collar formation might also be useful.

Figure 5:
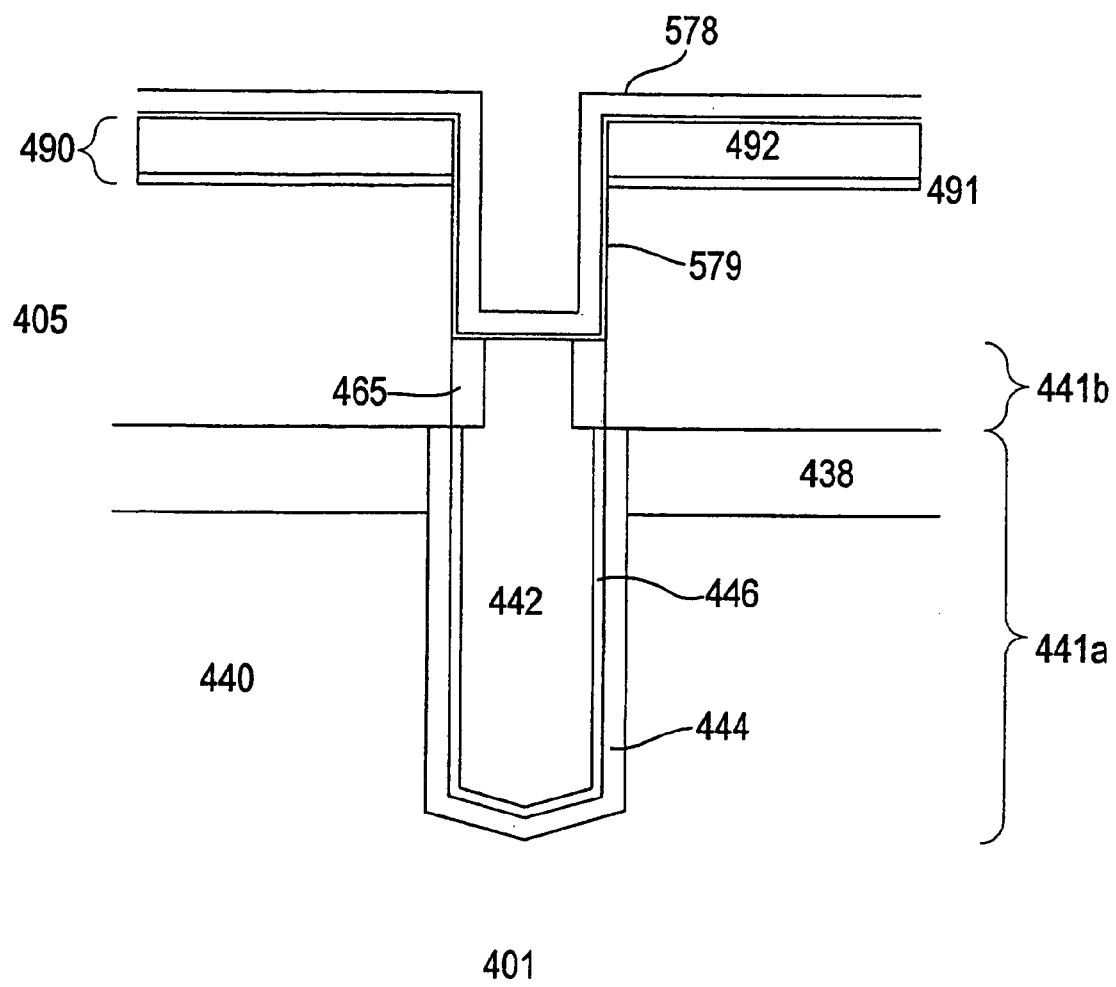

Referring to FIG. 5, the capacitor is recessed partially from the top section of the trench, leaving a portion of the collar remaining. The recess creates an upper trench opening above the capacitor. In one embodiment, the capacitor is recessed about 300–500 nm below the surface of the substrate. Recessing the capacitor to other depths above the top section is also useful. In accordance with one embodiment of the invention, the top surface of the capacitor is substantially planar. That is, the top of the recessed collar and top of the recessed first plate are substantially coplanar.

Typically, the collar and poly are recessed separately. In one embodiment, the poly is recessed first to a desired depth. After the poly is recessed, the collar above the poly is exposed. The exposed portion of the collar is then removed by, for example, isotropic wet chemical etching or dry etching. Other techniques for recessing the collar and poly can also be used.

A protective layer 579 is formed on at least the exposed trench sidewalls. The protective layer, for example, serves as an etch stop during subsequent process to remove strap material. In one embodiment, the protective layer comprises silicon nitride. Other types of protective material which can serve as an etch stop layer to strap material, can also be used. The thickness of the protective layer should be sufficient to protect the substrate during the etch process to remove the strap material. Typically, the thickness of the protective layer is about 0.5–3 nm. Other thicknesses are also useful. The nitride layer is formed by, for example, thermal nitridation. Other techniques for forming the protective layer are also useful. Such techniques include, for example, plasma nitridation techniques. The protective layer covers the pad layer, exposed trench sidewalls and top surface of the capacitor.

A strap layer 578 is deposited on the substrate, lining the substrate and upper trench opening. In one embodiment, the strap layer comprises silicon. Preferably, the strap layer comprises amorphous silicon. Other materials, such as SiGe and Ge, can also be used to form the strap layer. The strap layer is deposited by, for example, low pressure CVD. The thickness of the strap layer is typically about 20–50 nm. Other thicknesses can also be useful.

Figure 6:
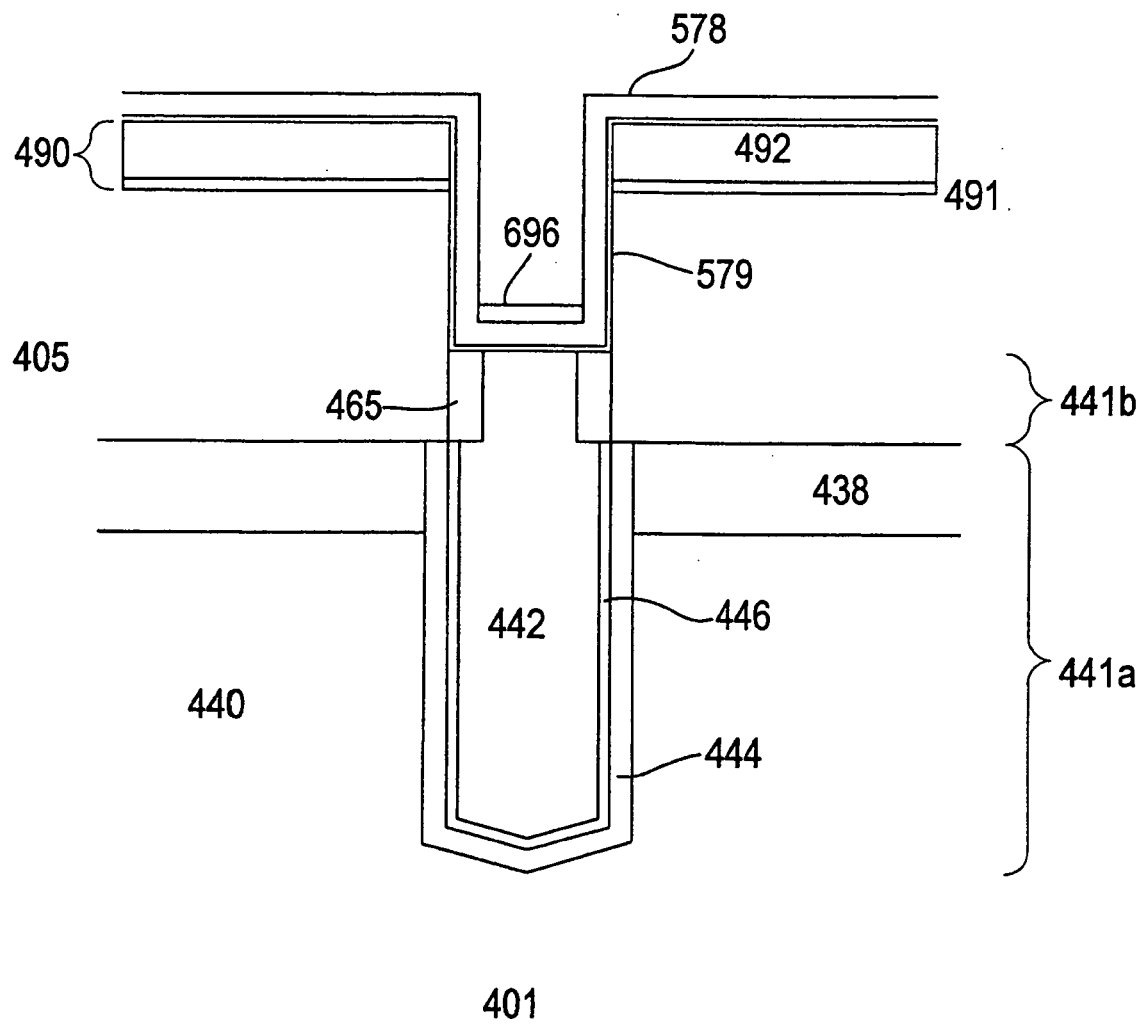

Referring to FIG. 6, a mask 696 is formed on the bottom surface of the upper trench opening. In one embodiment, the mask layer is formed by depositing an oxide layer by high density plasma (HDP) CVD. HDP CVD techniques deposit material horizontally at a higher rate than vertically. An etch, such as isotropic wet oxide etch like buffered or diluted HF (fluoric acid), is performed to remove the mask material on the sidewalls while leaving a part of the mask on the bottom of the trench. Alternatively, the mask layer is formed by implanting dopants on the surface of the strap layer in the bottom of the trench. The dopants, for example, comprise boron. The implantation, in one embodiment, is performed with a high dose and low energy. Implantation energies can, for example, be about 1–5 keV at a dose of 5e13 cm$^{-2}$–5e14 cm$^{-2}$. This results in a thin highly doped layer at the bottom of the trench opening.

Figure 7:
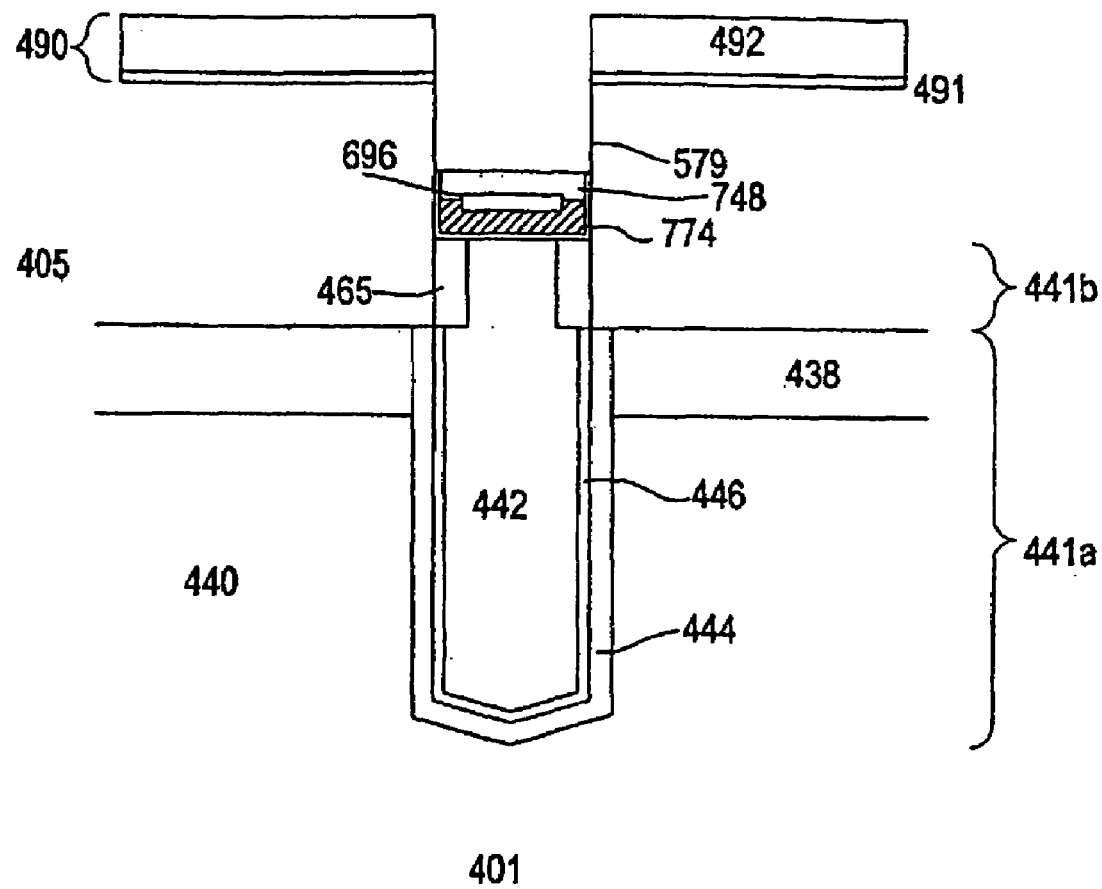

Referring to FIG. 7, an etch is performed to remove the strap material on the sidewalls of the trench. In one embodiment, isotropic wet or dry etch using diluted Na$_4$OH is performed selective to the protective and mask layers. The etch removes the strap material form the sidewalls, leaving a buried strap 774 at the bottom of the trench opening above the capacitor. In accordance with the invention, the process of forming the buried strap does not require filling of a divot as with conventional strap process. This results in improved strap reliability and device performance.

In one embodiment, a dielectric layer 748 is deposited on the substrate, covering the substrate surface and lining the trench opening above the capacitor. The dielectric layer comprises, for example, silicon oxide. The silicon oxide can be deposited by, for example, HDP CVD. Other techniques can also be sued to form the dielectric layer. The thickness of the dielectric layer is sufficient to isolate the capacitor from the transistor. Typically, the thickness of the dielectric layer is about 50–100 nm. The dielectric materials on the sidewalls are removed, leaving the isolation dielectric layer 748 on the bottom of the trench opening above the strap.

To form the second diffusion region, a thermal step can be performed to outdiffuse the dopant from the trench fill material 442 through the strap 774 into the silicon trench sidewall. The thermal step can be performed at any point in the process flow after formation of the strap. In one embodiment, the thermal step is performed at late as possible in the process flow. The thermal step is performed, for example, after the formation of the isolation layer 748 and prior to forming the gate oxide. Alternatively, the second diffusion region can be formed as a result of the various process steps in the process flow after formation of the buried strap.

The process flow continues to complete the memory cell. The memory cell is completed using various conventional processes. For example, the vertical transistor (e.g., first diffusion regions, gate oxide, gate) and interconnections to the bitlines and platelines including the necessary isolation between different interconnects are formed using conventional processes.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for fabricating a trench capacitor comprising:
   providing a substrate including a trench having an upper portion and a lower portion, the substrate being prepared with a trench capacitor in the lower portion of the trench, a top surface of the trench capacitor comprising dielectric collar and a trench fill material;
   etching said dielectric collar and trench fill material so that the top surfaces of said dielectric collar and trench fill material are coplanar; and
   forming a buried strap covering the coplanar top surfaces of the dielectric collar and trench fill material of the trench capacitor.

2. The method of claim 1 wherein said step of providing a trench capacitor comprises:
   forming a first capacitor plate around said lower portion of said trench;
   forming a dielectric layer on said lower portion of said trench; and
   filling said lower portion of said trench with said trench fill material to form a second capacitor plate.

3. The method of claim 1 further comprising the step of forming a vertical transistor in said upper portion of said trench, said transistor coupled to said trench capacitor to form a memory cell.

4. The method of claim 3 wherein said step of forming a vertical transistor comprises the steps of:
   disposing a gate in a portion of the upper portion of said trench, said gate having a first end extending toward a surface of the substrate and a second end extending toward the bottom of the upper portion of the trench;
   lining at least a portion of a sidewall of the upper portion of the trench adjacent to said gate with a gate oxide;
   forming a first diffusion region on a surface of the substrate surrounding at least a portion of said substrate adjacent said gate; and
   forming a second diffusion region in a portion of said substrate surrounding said buried strap, said second diffusion region coupling said vertical transistor to said trench capacitor.

5. The method of claim 1 wherein said buried strap is formed from a material selected from silicon, germanium or a combination thereof.

6. The method of claim 5 wherein said buried strap is formed of amorphously deposited silicon.

7. The method of claim 1 wherein said buried strap is formed with a thickness of between about 20 nm and 300 nm.

8. A method for fabricating a trench capacitor comprising:
   providing a substrate including a trench having an upper portion and a lower portion, said trench capacitor being formed in the lower portion of the trench, a top surface of the trench capacitor comprising a planar surface;
   depositing a layer of buried strap material over the substrate, the layer of buried strap material lining the trench sidewalls in the upper portion of the trench and top surface of the trench capacitor;
   forming a mask on a bottom surface of a trench opening in the upper portion of the trench; and
   removing the layer of buried strap material lining the trench sidewalls, leaving the layer of buried strap material covering the top surface of the capacitor to serve as the buried strap.

9. The method of claim 8 wherein said forming a trench capacitor comprises:
   forming a first capacitor plate around said lower portion of said trench;
   forming a dielectric layer on said lower portion of said trench; and
   filling said lower portion of said trench with said trench fill material to form a second capacitor plate.

10. The method of claim 8 further comprising the step of forming a vertical transistor in said upper portion of said trench, said transistor coupled to said trench capacitor to form a memory cell.

11. The method of claim 10 wherein said step of forming a vertical transistor comprises the steps of:
   disposing a gate in a portion of the upper portion of said trench, said gate having a first end extending toward a surface of the substrate and a second end extending toward the bottom of the upper portion of the trench;

lining at least a portion of a sidewall of the upper portion of the trench adjacent to said gate with a gate oxide;

forming a first diffusion region on a surface of the substrate surrounding at least a portion of said substrate adjacent said gate; and forming a second diffusion region in a portion of said substrate surrounding said buried strap, said second diffusion region coupling said vertical transistor to said trench capacitor.

12. The method of claim 8 wherein said buried strap is formed from a material selected from silicon, germanium or a combination thereof.

13. The method of claim 12 wherein said buried strap is formed of amorphously deposited silicon.

14. The method of claim 8 wherein said buried strap is formed with a thickness of between about 20 nm and 300 nm.

* * * * *